(12) United States Patent
Wang et al.

(10) Patent No.: US 11,043,608 B1
(45) Date of Patent: Jun. 22, 2021

(54) METHOD AND APPARATUS FOR MANUFACTURING SEMICONDUCTOR SHEET ASSEMBLY

(71) Applicants: ZHEJIANG JINKO SOLAR CO., LTD., Haining (CN); JINKO SOLAR CO., LTD., Jiangxi (CN)

(72) Inventors: Luchuang Wang, Haining (CN); Wusong Tao, Haining (CN); Zhiqiu Guo, Haining (CN); Yang Bai, Haining (CN); Xueming Zhang, Haining (CN)

(73) Assignees: ZHEJIANG JINKO SOLAR CO., LTD., Haining (CN); JINKO SOLAR CO., LTD., Jiangxi (CN)

(*) Notice: Subject to any disclaimer, the term of this patent is extended or adjusted under 35 U.S.C. 154(b) by 0 days.

(21) Appl. No.: 17/006,694

(22) Filed: Aug. 28, 2020

(30) Foreign Application Priority Data

Aug. 10, 2020 (CN) .......................... 202010793095.2

(51) Int. Cl.
*H01L 31/18* (2006.01)
*H01L 31/05* (2014.01)
*H01L 31/048* (2014.01)

(52) U.S. Cl.
CPC .......... *H01L 31/188* (2013.01); *H01L 31/048* (2013.01); *H01L 31/0504* (2013.01); *H01L 31/186* (2013.01)

(58) Field of Classification Search
CPC ... H01L 31/188; H01L 31/048; H01L 31/186; H01L 31/0504; H01L 21/67288; H01L 22/12; H01L 22/24
See application file for complete search history.

(56) References Cited

U.S. PATENT DOCUMENTS 5,457,057 A * 10/1995 Nath .................. H01L 31/1804
438/67
2016/0284925 A1* 9/2016 Harley ................ H01L 31/0475

FOREIGN PATENT DOCUMENTS

| CN | 104900758 A | 9/2015 |
| CN | 110767778 A | 2/2020 |
| CN | 210154896 U | 3/2020 |
| JP | 2012134226 A | 7/2012 |

OTHER PUBLICATIONS

Office Action, CN Application No. 202010793095.2, dated Oct. 13, 2020, 11 pgs.
Zhejiang Jinko Solar Co., Ltd., European Search Report, EP20193544.2, dated Feb. 10, 2021, 7 pgs.
Zhejiang Jinko Solar Co., Ltd., First Office Action (CN), CN202010793095.2, dated Oct. 13, 2020, 22 pgs.
Zhejiang Jinko Solar Co., Ltd., Second Office Action (CN), CN202010793095.2, dated Oct. 29, 2020, 18 pgs.

* cited by examiner

*Primary Examiner* — Earl N Taylor
(74) *Attorney, Agent, or Firm* — USCH Law, PC (57) ABSTRACT

The present disclosure relates to a method and apparatus for manufacturing a semiconductor sheet assembly. The method for manufacturing a semiconductor sheet assembly includes positioning a semiconductor sheet, and determining a first region to be grooved and a defect position in the first region; cutting and grooving the semiconductor sheet along the defect position in the first region; and splitting the semiconductor sheet that is cut and grooved.

16 Claims, 4 Drawing Sheets

METHOD AND APPARATUS FOR MANUFACTURING SEMICONDUCTOR SHEET ASSEMBLY

CROSS-REFERENCE TO RELATED APPLICATION

This application claims the benefit of priority to Chinese Patent Application No. 202010793095.2 filed on Aug. 10, 2020 and entitled "METHOD AND APPARATUS FOR MANUFACTURING SEMICONDUCTOR SHEET ASSEMBLY", the disclosure of which is incorporated by reference herein in its entirety.

TECHNICAL FIELD

The present disclosure relates to the field of semiconductor technology, in particular to a method and apparatus for manufacturing a semiconductor sheet assembly.

BACKGROUND

Currently, a semiconductor sheet is cut into a plurality of smaller semiconductor split sheets by laser scribing and mechanical splitting, or by laser grooving combined with forming instant compressive stress and tensile stress in the semiconductor sheet through cold-hot combination.

Although such methods in the existing art may be useful in splitting a semiconductor sheet efficiently, they tend to cause problems such as cracking after the semiconductor sheet is cut.

SUMMARY

The objective of some embodiments of the present disclosure is to provide a method and apparatus for manufacturing a semiconductor sheet assembly, in order to solve the problem that cracking is easy to occur after semiconductor sheet cutting.

In order to solve the above technical problem, the present disclosure provides a method for manufacturing a semiconductor sheet assembly, sequentially including:

S1: positioning a semiconductor sheet, and determining a first region to be grooved and a defect position in the first region;

S2: cutting and grooving the semiconductor sheet along the defect position in the first region; and S3: splitting the semiconductor sheet that is cut and grooved.

Compared with the existing art, this embodiment of the present disclosure includes positioning a semiconductor sheet, determining a first region to be grooved and a defect position in the first region, cutting and grooving the semiconductor sheet along the defect position in the first region, and splitting the semiconductor sheet that is cut and grooved. In this way, cracking after cutting a semiconductor sheet is reduced by splitting along a defect position in the first region.

In some embodiments, in the manufacturing method, the step S1 specifically includes:

positioning the semiconductor sheet and determining a first region to be grooved; and acquiring gray values of a plurality of positions in the first region, and taking a position of which the gray value is larger than or equal to 50% as the defect position.

In some embodiments, in the manufacturing method, the step S2 includes: cutting and grooving the semiconductor sheet along the defect position in the first region and an edge point, wherein the edge point is an intersection point of a middle line of the semiconductor sheet and an edge of the semiconductor sheet.

In some embodiments, in the manufacturing method, the step S2 specifically includes: performing discontinuous laser dotting and grooving on the semiconductor sheet along the defect position in the first region.

In some embodiments, in the manufacturing method, the step S3 sequentially includes:

performing heating treatment on the semiconductor sheet that is cut and grooved;

cooling and corroding a heated semiconductor sheet.

Preferably, in the manufacturing method, the step of cooling and corroding the heated semiconductor sheet includes:

cooling and corroding the heated semiconductor sheet by using a cooling liquid, and the cooling liquid contains a corrosive acidic or alkaline substance.

Preferably, the manufacturing method further includes a step after the step S3:

S4: sequentially arranging cutting edges of a plurality of semiconductor split sheets formed by splitting in the step S3 in a first direction, and connecting two adjacent semiconductor split sheets of the plurality of semiconductor split sheets by using an interconnection strip.

In some embodiments, in the manufacturing method, in the step S4, the interconnection strip has a first section and a second section that extend in the first direction, and an intermediate section respectively connected to the first section and the second section; the first section is in a metalized electrical connection to an upper surface of one of the semiconductor split sheets, the second section is in a metalized electrical connection to a lower surface of a next semiconductor split sheet of the semiconductor split sheets in the first direction, to form a semiconductor sheet string.

Preferably, the manufacturing method further includes a step after the step S4:

S5: sequentially overlapping a glass panel, a first adhesive film, the semiconductor sheet string, a second adhesive film and a back plate to form an overlapped structure, and laminating the overlapped structure.

In some embodiments, in the manufacturing method, in the step S5, the cutting edge of the semiconductor sheet string is arranged facing the glass panel.

In order to achieve the above objective, the present disclosure further provides an apparatus for manufacturing a semiconductor sheet assembly, including:

a positioning and detecting structure, configured to position a semiconductor sheet, and determine a first region to be grooved and a defect position in the first region;

a grooving structure, configured to cut and groove the semiconductor sheet along the defect position in the first region; and a splitting structure, configured to split the semiconductor sheet that is cut and grooved.

Preferably, in the manufacturing apparatus, the positioning and detecting structure specifically includes:

a positioning structure, configured to position the semiconductor sheet and determine a first region to be grooved; and a detecting structure, configured to acquire gray values of a plurality of positions in the first region, and taking a position of which the gray value is larger than or equal to 50% as the defect position.

In some embodiments, in the manufacturing apparatus, the splitting structure is further configured to cut and groove the semiconductor sheet along the defect position in the first region and an edge point, and the edge point is an intersection point of a middle line of the semiconductor sheet and an edge of the semiconductor sheet.

Preferably, in the manufacturing apparatus, the grooving structure may be a laser grooving structure configured to perform discontinuous laser dotting and grooving on the semiconductor sheet along the defect position in the first region.

In some embodiments, in the manufacturing apparatus, the splitting structure includes:

a heater, configured to perform heating treatment on the semiconductor sheet that is cut and grooved; and a cooling apparatus, configured to cool and corrode a heated semiconductor sheet.

In some embodiments, in the manufacturing apparatus, the cooling apparatus contains a cooling liquid having a corrosive acidic or alkaline substance.

In some embodiments, the manufacturing apparatus further includes a connecting structure configured to sequentially arrange cutting edges of a plurality of semiconductor split sheets formed by splitting by the splitting structure in a first direction, and to connect two adjacent semiconductor split sheets of the plurality of semiconductor split sheets by using an interconnection strip, to form a semiconductor sheet string.

Preferably, in the manufacturing apparatus, the interconnection strip has a first section and a second section that extend in the first direction, and an intermediate section respectively connected to the first section and the second section, the first section is in a metalized electrical connection to an upper surface of one of the semiconductor split sheets, and the second section is in a metalized electrical connection to a lower surface of a next semiconductor split sheet of the semiconductor split sheets in the first direction.

Preferably, the manufacturing apparatus further includes a laminating structure configured to overlap a glass panel, a first adhesive film, the semiconductor sheet string, a second adhesive film and a back plate that are arranged sequentially in a second direction to form an overlapped structure, and to laminate the overlapped structure.

In some embodiments, in the manufacturing apparatus, the cutting edge in the semiconductor sheet string is arranged facing the glass panel.

BRIEF DESCRIPTION OF THE DRAWINGS

One or more embodiments are described as examples with reference to the corresponding figures in the accompanying drawings, and the examples do not constitute a limitation to the embodiments. Elements with the same reference numerals in the accompanying drawings represent similar elements. The figures in the accompanying drawings do not constitute a proportion limitation unless otherwise stated.

| Reference numerals: | | | |
|---|---|---|---|
| Reference numerals | Names | Reference numerals | Names |
| 11 | Positioning and detecting structure | 22 | Interconnection Strip |
| 12 | Grooving Structure | 221 | First Section |
| 13 | Splitting Structure | 222 | Intermediate Section |
| 14 | Connecting Structure | 223 | Second Section |
| 15 | Laminating Structure | 31 | Glass Panel |
| 2 | Semiconductor Sheet String | 32 | First Adhesive Film |
| 21 | Semiconductor Split Sheet | 33 | Second Adhesive Film |
| 211 | Cutting Edge | 34 | Back Plate |
| 212 | Split Surface | | |

DETAILED DESCRIPTION

The implementation, functional features and advantages of the present disclosure will be further described with reference to embodiments and the accompanying drawings.

The technical solutions in embodiments of the present disclosure will be described clearly and completely with reference to the drawings in the embodiments of the present disclosure. It is obvious that the described embodiments are only some rather than all embodiments of the present disclosure. All other embodiments, which can be obtained by a person skilled in the art without any inventive effort based on the embodiments of the present disclosure, are within the scope of protection of the present disclosure.

It shall be noted that, if directional indications (such as above, below, left, right, front, and back . . . ) are included in the embodiment of the present disclosure, the directional indications are only used for explaining relative position relationships between the components, motion conditions, and the like in a certain form (as shown in the drawings). If the certain form is changed, the directional indications are changed accordingly.

In addition, if there is a description including "first", "second", etc. in the embodiments of the present disclosure, the description of "first", "second", etc. is for descriptive purposes only and is not to be construed as indicating or implying relative importance or the number of technical features indicated. Thus, a feature defined as "first" or "second" may explicitly or implicitly include at least one of the features. In addition, technical solutions between the embodiments may be combined with each other, but must be based on realization of the technical solutions by a person skilled in the art, and when the technical solutions are contradictory to each other or cannot be realized, such a combination shall not be considered to exist, and is not within the protection scope of the present disclosure.

Figure 1:
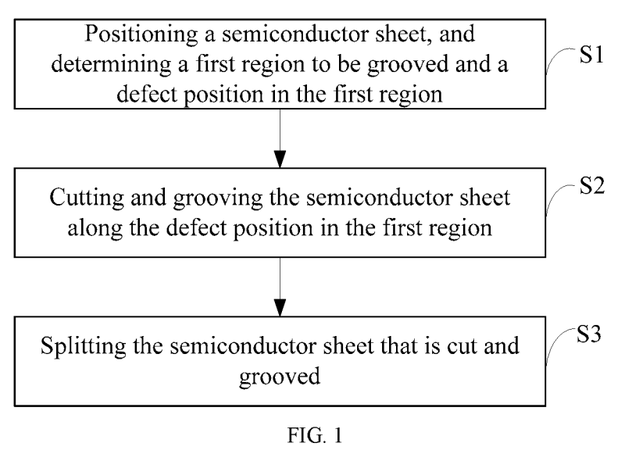
FIG. 1 is a schematic flow chart of a method for manufacturing a semiconductor sheet assembly according to the present disclosure.

The present disclosure provides a method for manufacturing a semiconductor sheet assembly. FIG. 1 shows a schematic flow chart of a method for manufacturing a semiconductor sheet assembly according to the present disclosure.

In this embodiment, the method for manufacturing a semiconductor sheet assembly includes:

Step S1: positioning a semiconductor sheet, and determining a first region to be grooved and a defect position in the first region.

Herein, if the semiconductor sheet is split into two pieces, the first region is within a predetermined range along a middle line of the semiconductor sheet. In this embodiment, the predetermined range of the middle line is a region within ±0.05 mm of the middle line. The semiconductor sheet may also be split into a plurality of pieces, for example, three pieces, four pieces and so on. When the split sheets are a plurality of pieces, the first region is within a predetermined range along a bisectrix of a plurality of equal parts of the semiconductor sheet, for example, when the split sheets are three, the first region is within a predetermined range along a bisectrix of a trisection of the semiconductor sheet; when the split sheets are four, the first region is within a predetermined range along a bisectrix of quartering of the semiconductor sheet, and so on. A defect position refers to a position on the semiconductor sheet where a crack or other defect is present. In this embodiment, the semiconductor sheet is a photovoltaic cell.

In a specific embodiment, the step S1 sequentially includes steps S11 and S12:

S11: positioning the semiconductor sheet and determining a first region to be grooved.

In implementation, a positioning structure may be configured to position the semiconductor sheet. Herein, the positioning structure may be, for example, a charge coupled device (CCD)-positioning apparatus, or the positioning may be performed by using another camera apparatus, which is not herein limited.

S12: acquiring gray values of a plurality of positions in the first region, and taking a position of which the gray value is larger than or equal to 50% as the defect position.

In a specific embodiment, defect distribution of the semiconductor sheet in the first region can be determined through a detecting structure, to determine the defect position in the first region. In particular, the detecting structure may be, for example, a photoluminescence (PL) detecting structure. Herein, a gray-scale value in the step S12 refers to a color depth of a point in a black-and-white image. A gray-scale value of a defect position is larger than that of a normal region. Therefore, in this embodiment, a position with a gray-scale value larger than or equal to a gray-scale threshold is taken as a defect position. In this embodiment, the gray-scale threshold is 50%. In other embodiments, the gray-scale threshold may be other values, for example, 60% or 70%, etc.

The method for manufacturing a semiconductor sheet assembly further includes a step S2: cutting and grooving the semiconductor sheet along the defect position in the first region.

Herein, Step S2 may be: cutting and grooving the semiconductor sheet along the defect position in the first region and an edge point, wherein the edge point is an intersection point of a bisectrix of the semiconductor sheet and an edge of the semiconductor sheet. A connecting line of the defect position and the intersection point is substantively perpendicular to the edge of the semiconductor sheet. In one specific embodiment, the semiconductor sheet is rectangular, and the semiconductor sheet in the embodiment has four edges.

Step S2 may be: performing discontinuous laser dotting and grooving on the semiconductor sheet along the defect position in the first region. Herein, the discontinuous laser dotting and grooving refers to using a laser to dot and groove along a plurality of dots provided at intervals. By performing dotting and grooving along a/each defect position determined in the step S1 through discontinuous laser dotting, damage to the semiconductor sheet is small, and occurrence of cracking in the semiconductor sheet can be further reduced. In other embodiments, the grooving may be performed by using an etching machine, or other conventional grooving methods may be used, which is not limited herein.

The method for manufacturing a semiconductor sheet assembly further includes a step S3: splitting the semiconductor sheet that is cut and grooved.

Herein, the splitting the semiconductor sheet that is cut and grooved in the step S3 may be performed by using a conventional mechanical splitting method, or using a cold-and-hot combined splitting method. For example, a laser beam or other heaters with high-energy density is used for path guidance heating according to a grooving position, and a liquid cooling method is used for processing the heated region after the heating. In this way, the region can generate a compressive stress and a tensile stress in a process of alternating heating and cooling, thereby splitting the semiconductor sheet along a guidance path. Traditional mechanical splitting is performed by splitting the semiconductor sheet using a rigid member, which easily causes small cracking. However, in this embodiment, a splitting method of heating and cooling combined is used and it is not required to contact the rigid member directly, thereby preventing the condition or cracking during splitting. In the embodiment, the Step S3 includes sequentially steps S31 and S32 as below.

Step S31: performing heating treatment on the semiconductor sheet that is cut and grooved.

In implementation, a heater with high-energy density, or a laser beam may be applied.

Step S32: cooling and corroding a heated semiconductor sheet.

Herein, the step S32 includes cooling and corroding the heated semiconductor sheet by using a cooling liquid that contains a corrosive acidic or alkaline substance. This step may further reduce cracking of the semiconductor sheet. Besides, flatness of the split surface 212 may be improved by performing an appearance treatment on a cutting edge and a split surface 212 after splitting. Herein, the split surface 212 is a surface formed by breaking the semiconductor sheet from the cutting edge. Specifically, small cracks in the splitting process can be reduced by corroding the cutting edge and the split surface 212 after the splitting, thereby improving the flatness of the split surface 212 formed after the semiconductor sheet is split, and reducing the number of small cracks of the split surface 212. In one preferred embodiment, the flatness of the small cracks in the main gate region of the split surface 212 of the semiconductor sheet may be partially improved in step 32 to reduce or even eliminate the small cracks. Herein, the corrosive acidic or alkaline substance may be a conventional corrosive acidic (for example, sulfuric acid) or alkaline substance, which is not particularly limited herein.

Compared with the existing art, this embodiment of the present disclosure includes positioning a semiconductor sheet, determining a first region to be grooved and a defect position in the first region, cutting and grooving the semiconductor sheet along the defect position in the first region, and splitting the semiconductor sheet that is cut and grooved. In this way, cracking after cutting a semiconductor sheet is reduced by splitting along a defect position in the first region.

Figure 2:
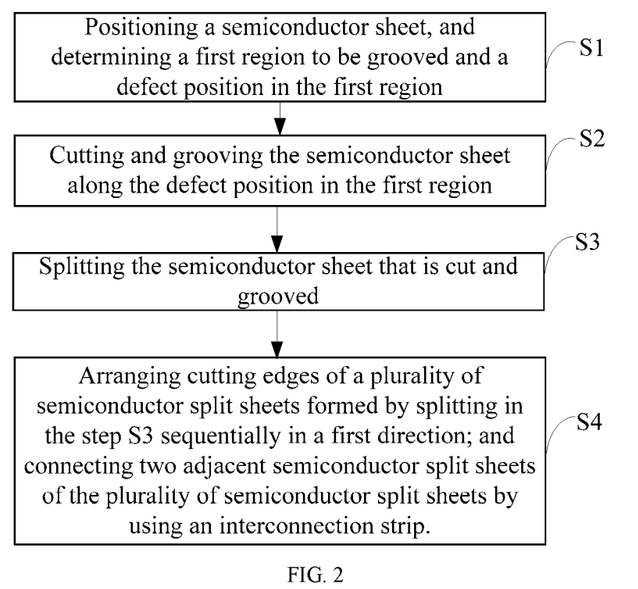
FIG. 2 is a schematic flow chart of a method for manufacturing the semiconductor sheet assembly according to the present disclosure.
Figure 5:
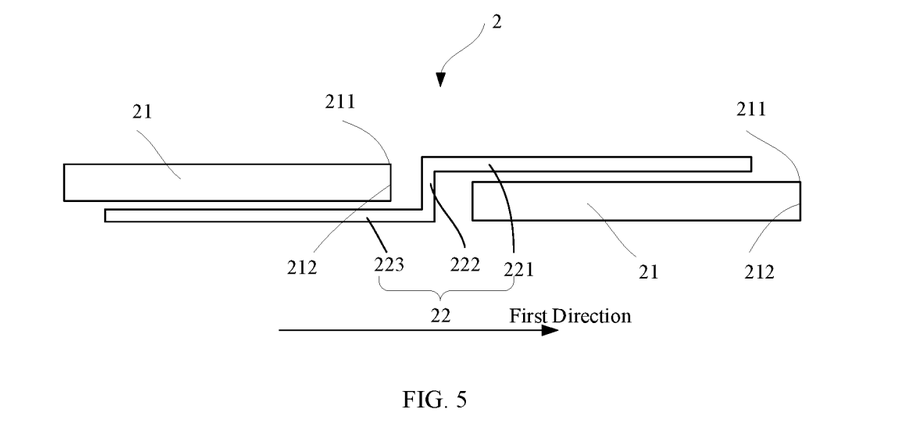
FIG. 5 is a schematic diagram showing a structure of a semiconductor sheet string according to the present disclosure.

With reference to FIG. 2 and FIG. 5. FIG. 2 is a schematic flow chart of a method for manufacturing a semiconductor sheet assembly according to the present disclosure. FIG. 5 is a schematic diagram showing a structure of a semiconductor sheet string according to the present disclosure. In an embodiment, after the step S3, the method for manufacturing the semiconductor sheet assembly further includes the following steps:

Step S4: sequentially arranging cutting edges 211 of a plurality of semiconductor split sheets 21 formed by splitting in the step S3 in a first direction, and connecting two adjacent semiconductor split sheets 21 of the plurality of semiconductor split sheets by using an interconnection strip 22, to form a semiconductor sheet string 2.

Herein, the cutting edge 211 is where the semiconductor sheet is cut and grooved (i.e., an inside wall of a cut groove of the semiconductor sheet when the semiconductor sheet is cut and grooved). Take the semiconductor split sheets 21 in FIG. 5 as an example. In FIG. 5, the cutting edge 211 is provided at an upper edge of each semiconductor split sheet 21. The first direction in the step S4 is generally a transmission direction of the plurality of semiconductor split sheets 21 when welding. In this embodiment, the first direction may be a transmission direction of a stringer (i.e., a series welding machine) when welding the plurality of semiconductor split sheets 21.

Specifically, in the step S4, the interconnection strip 22 has a first section 221 and a second section 223 extending in the first direction, and an intermediate section 222 respectively connected to the first section 221 and the second section 223. The first section 221 is in a metalized electrical connection to an upper surface of one of the semiconductor split sheets 21, and the second section 223 is in a metalized electrical connection to a lower surface of a next semiconductor split sheet 21 of the semiconductor split sheets in the first direction. In this way, cutting edges 211 of the plurality of semiconductor split sheets 21 are arranged in the first direction, and the plurality of semiconductor split sheets 21 are serially connected to form a semiconductor sheet string. In this embodiment, there are two semiconductor split sheets 21. The cutting edges 211 are arranged in the first direction, which is advantageous for rotating the semiconductor sheet string as a whole by 180° and for arranging the cutting edges 211 in the semiconductor sheet string 2 in the same direction during lamination in the following steps. The method for manufacturing the semiconductor sheet assembly provided in the embodiment of the present disclosure can connect the plurality of semiconductor split sheets together through the interconnection strip 22.

Figure 6:
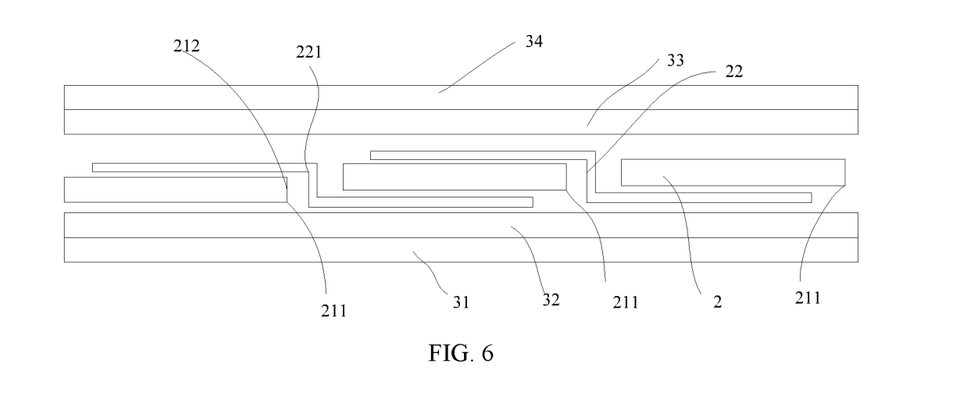
FIG. 6 is a schematic diagram showing a structure of the semiconductor sheet assembly according to the present disclosure.

With reference to FIG. 3 to FIG. 8, FIG. 3 is a schematic flow chart of a method for manufacturing the semiconductor sheet assembly according to the present disclosure. FIG. 6 is a schematic diagram showing a structure of the semiconductor sheet assembly according to the present disclosure. The direction of the semiconductor sheet string in FIG. 6 is different from the direction of the semiconductor sheet string in FIG. 5. FIG. 6 is obtained by rotating the semiconductor sheet string in FIG. 5 by 180°, so that the cutting edges 211 in the semiconductor sheet string 2 are arranged facing (i.e., close to) a glass panel.

Figure 3:
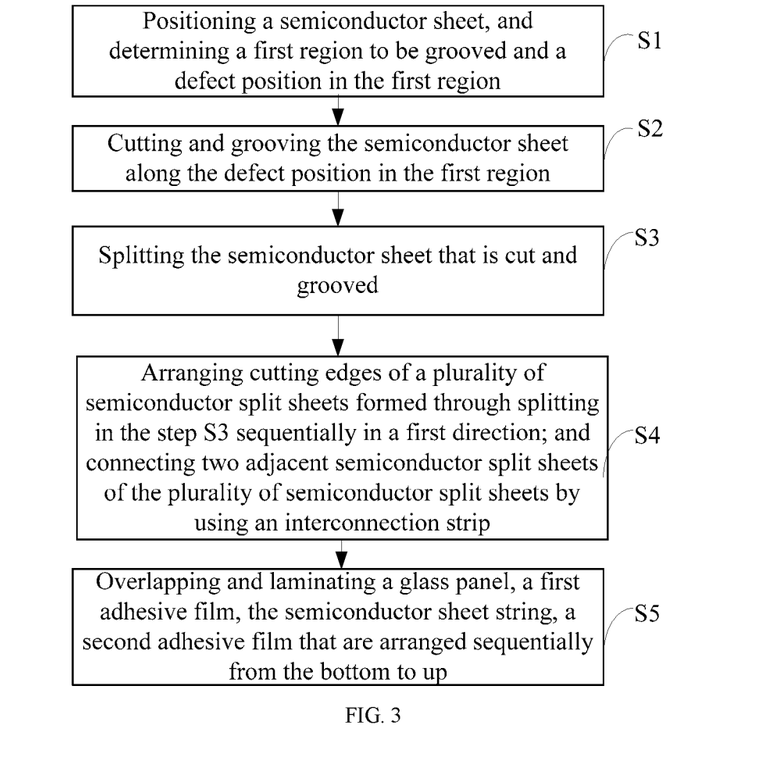
FIG. 3 is a schematic flow chart of a method for manufacturing the semiconductor sheet assembly according to the present disclosure.

In an embodiment, the method for manufacturing the semiconductor sheet assembly further includes a step after the step S4:

Step S5: overlapping the glass panel 31, a first adhesive film 32, the semiconductor sheet string 2, a second adhesive film 33 and a back plate 34 sequentially to form an overlapped structure, and laminating the overlapped structure.

In FIG. 6, an overlapped structure includes, from top to bottom: the back plate 34, the second adhesive film 33, the semiconductor sheet string 2, the first adhesive film 32 and the glass panel 31. A direction in which a lamination pressure is applied is perpendicular to the back plate 34 from top to bottom. That is, a pressure may be applied from the back plate 34 downward to the lamination structure in FIG. 6, so that the entire overlapped structure is laminated to form a photovoltaic assembly.

Figure 7:
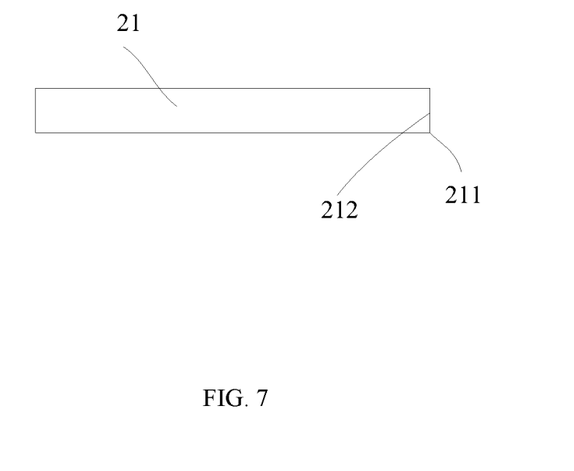
FIG. 7 is a schematic diagram showing part of a semiconductor split sheet.
Figure 8:
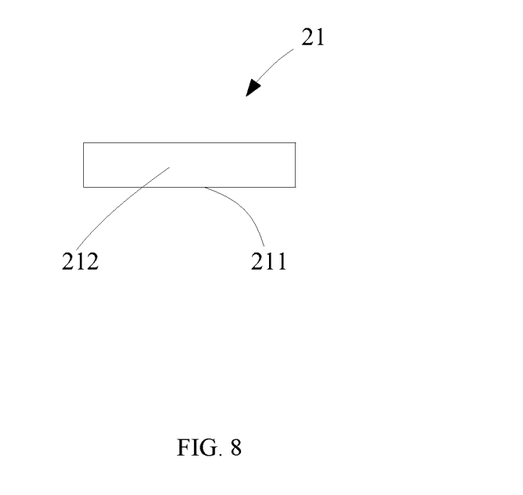
FIG. 8 is a right-side view of FIG. 7.

FIG. 7 is a schematic diagram showing part of a semiconductor split sheet 21 in FIG. 6; FIG. 8 is a right-side view of FIG. 7. After splitting of the semiconductor sheet, at least two semiconductor split sheets 21 are formed. Each semiconductor split sheet 21 has a split surface 212 which is formed by splitting the semiconductor split sheet 21 from a cutting edge 211.

Specifically, in step S5, the cutting edge 211 of the semiconductor sheet string 2 may be arranged facing the glass panel 31. As shown in FIG. 6, the cutting edge 211 of each semiconductor split sheet 21 is arranged downward, i.e., facing the glass panel 31. That is, the cutting edge 211 of the semiconductor split sheet 21 is located at a position away from where the lamination pressure is applied. In this way, buffering is more sufficient and cracking of the semiconductor sheet during lamination is effectively reduced from occurring. Besides, preferably, the cutting edge 211 of the semiconductor split sheets 21 does not contact the interconnection strip 22. Therefore, during lamination, the cutting edges 211 of the plurality of semiconductor sheet string 2 may be prevented from directly contacting the interconnection strip 22, thereby further reducing cracking from occurring to the semiconductor sheets.

In FIG. 6, after obtaining the semiconductor sheet string 2 by rotating the entire semiconductor sheet string 2 in FIG. 5 by 180°, the cutting edge 211 of the semiconductor sheet string 2 is arranged facing the glass panel 31, the interconnection strip 22 and the glass panel 31 are both hard materials, and the cutting edge 211 is located at a side of the interconnection strip 22 and the glass panel 31. In this way, during lamination, cutting edges 211 of the plurality of semiconductor sheet strings 2 may be prevented from directly contacting a hard material, thereby buffering is more sufficient and cracking is effectively reduced from occurring during lamination. Conversely, if the cutting edge 211 of the semiconductor sheet string 2 is arranged away from the glass panel and the cutting edge 211 is clamped between the interconnection strip 22 and the glass panel 31, the interconnection strip 22 and the glass panel 31 may press the cutting edge 211 during lamination, making cracking easy to occur.

In implementation, the glass panel 31, the first adhesive film 32, the semiconductor sheet string 2, the second adhesive film 33 and the back plate 34 are overlapped to form the overlapped structure, which then enters a laminating machine for lamination. A direction in which pressure is applied is perpendicular to the overlapped structure. A specific processing of lamination is a conventional lamination technique (for example, assembly preparation is completed through such steps of edge trimming, framing, power test and EL test), which is not specifically limited herein.

Figure 4:
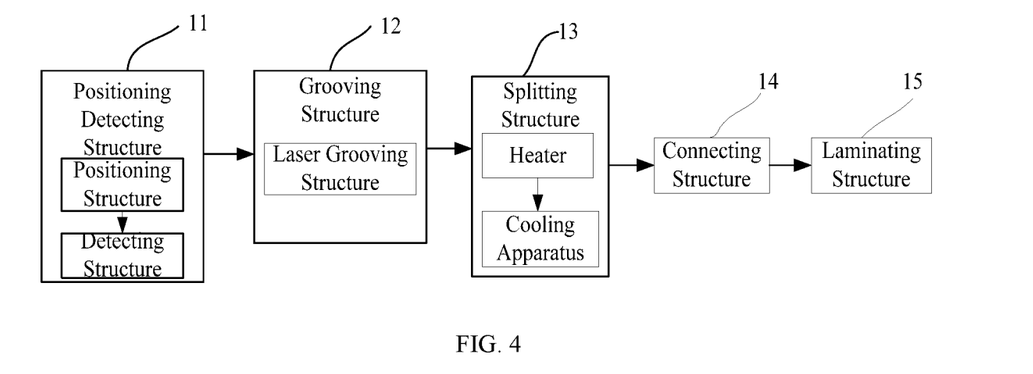
FIG. 4 is a block diagram showing a structure of an apparatus for manufacturing a semiconductor sheet assembly according to the present disclosure.

FIG. 4 is a block diagram showing a structure of an apparatus for manufacturing a semiconductor sheet assembly according to the present disclosure. As shown in FIG. 4, the apparatus for manufacturing a semiconductor sheet assembly provided in the embodiment of the present disclosure includes a positioning and detecting structure 11, a grooving structure 12 and a splitting structure 13. The positioning and detecting structure 11 is configured to position a semiconductor sheet, and determine a first region to be grooved and a defect position in the first region. The grooving structure 12 is configured to cut and groove the semiconductor sheet along the defect position in the first region. The splitting structure 13 is configured to split the semiconductor sheet that is cut and grooved.

Herein, the positioning and detecting structure 11 includes a positioning structure and a detecting structure. The positioning structure is configured to position the semiconductor sheet and determine a first region to be grooved. Herein, the positioning structure may be, for example, a charge coupled device (CCD) positioning apparatus, or positioning may be performed by using another camera apparatus, and is not herein limited. The detecting structure is configured to acquire gray values of the first region in the semiconductor sheet, and taking a position of which the gray value is larger than or equal to 50% as the defect position. Specifically, the detecting structure may, for example, be a photoluminescence (PL) detecting structure, which is not specifically limited.

The grooving structure 12 may be of a conventional grooving manner. In one preferable embodiment, the grooving structure 12 may, for example, be a laser grooving structure configured to perform discontinuous laser dotting and grooving on the semiconductor sheet along the defect position in the first region.

The splitting structure 13 may be a mechanical splitting structure, or splitting may be performed in a cold-and-hot combined manner. In this embodiment, the splitting structure 13 includes a heater and a cooling apparatus. The heater is configured to perform heating treatment on a semiconductor sheet that is cut and grooved, and the cooling apparatus is configured to cool and corrode the heated semiconductor sheet.

Further, a connecting structure 14 is included. The connecting structure 14 is configured to sequentially arrange cutting edges 211 of a plurality of semiconductor split sheets 21 formed by splitting of the splitting structure 13 in a first direction. Two adjacent semiconductor split sheets 21 of the plurality of semiconductor split sheets 21 are connected by using an interconnection strip 22, to form a semiconductor sheet string 2.

Further, a laminating structure 15 is included. The laminating structure 15 is configured to overlap a glass panel 31, a first adhesive film 32, a semiconductor sheet string 2, a second adhesive film 33 and a back plate 34 sequentially to form an overlapped structure, and to laminate the overlapped structure 15. In this embodiment, the laminating structure 15 is a laminating machine.

It shall be noted that the embodiment of the apparatus for manufacturing the semiconductor sheet assembly is an embodiment of the apparatus corresponding to the method for manufacturing the semiconductor sheet assembly. Therefore, the embodiment of the apparatus provided in the present disclosure may be implemented in coordination with the embodiment of the method for manufacturing the semiconductor sheet assembly. Technical details in the embodiment of the method for manufacturing the semiconductor sheet assembly still work in the embodiment of the apparatus for manufacturing the semiconductor sheet assembly. The technical effect achieved by the embodiment of the method for manufacturing the semiconductor sheet assembly may also be realized in the embodiment of the apparatus provided in the present disclosure, and is not repeated to avoid repetition. Correspondingly, relevant technical details in the embodiment of the apparatus provided in the present disclosure may be applied to the embodiment of the method for manufacturing the semiconductor sheet assembly.

The above description is only preferred embodiments of the present disclosure, and is not intended to limit the scope of the present disclosure. Under the conception of the present disclosure, all equivalent structural changes made by using the contents of the present specification and the drawings, or any other related technical fields directly/indirectly applied to the present disclosure are included in the scope of the present disclosure.

What is claimed is:

1. A method for manufacturing a semiconductor sheet assembly, sequentially comprising steps of:
   S1: positioning a semiconductor sheet, and determining a first region to be grooved and a defect position in the first region;
   S2: cutting and grooving the semiconductor sheet along the defect position in the first region; and
   S3: splitting the semiconductor sheet that is cut and grooved; wherein the step S3 sequentially comprises:
   performing heating treatment on the semiconductor sheet that is cut and grooved; and
   cooling and corroding a heated semiconductor sheet; wherein the step of cooling and corroding the heated semiconductor sheet comprises:
   cooling and corroding the heated semiconductor sheet by using a cooling liquid, wherein the cooling liquid contains a corrosive acidic or alkaline substance.

2. The method for manufacturing the semiconductor sheet assembly of claim 1, wherein the step S1 specifically comprises:
   positioning the semiconductor sheet and determining a first region to be grooved; and
   acquiring gray values of a plurality of positions in the first region, and taking a position of which the gray value is larger than or equal to 50% as the defect position.

3. The method for manufacturing the semiconductor sheet assembly of claim 1, wherein the step S2 comprises:
   cutting and grooving the semiconductor sheet along the defect position in the first region and an edge point, wherein the edge point is an intersection point of a bisectrix of the semiconductor sheet and an edge of the semiconductor sheet.

4. The method for manufacturing the semiconductor sheet assembly of claim 1, wherein the step S2 specifically comprises:
   performing discontinuous laser dotting and grooving on the semiconductor sheet along the defect position in the first region.

5. The method for manufacturing the semiconductor sheet assembly of claim 1, further comprising a step after step S3:
   S4: arranging cutting edges of a plurality of semiconductor split sheets formed by splitting in the step S3 sequentially in a first direction; and
   connecting two adjacent semiconductor split sheets of the plurality of semiconductor split sheets by using an interconnection strip.

6. The method for manufacturing the semiconductor sheet assembly of claim 5, wherein in the step S4, the interconnection strip comprises a first section and a second section that extend in the first direction, and an intermediate section respectively connected to the first section and the second section; wherein the first section is in a metalized electrical connection to an upper surface of one of the semiconductor split sheets, the second section is in a metalized electrical connection to a lower surface of a next semiconductor split sheet of the semiconductor split sheets in the first direction, to form a semiconductor sheet string.

7. The method for manufacturing the semiconductor sheet assembly of claim 5, further comprising a step after Step S4:
- S5: overlapping a glass panel, a first adhesive film, the semiconductor sheet string, a second adhesive film and a back plate sequentially to form an overlapped structure, and
- laminating the overlapped structure.

8. The method for manufacturing the semiconductor sheet assembly of claim 7, wherein in the step S5, the cutting edge of the semiconductor sheet string is arranged facing the glass panel.

9. An apparatus for manufacturing a semiconductor sheet assembly, comprising:
- a positioning and detecting structure, configured to position a semiconductor sheet, and determine a first region to be grooved and a defect position in the first region;
- a grooving structure, configured to cut and groove the semiconductor sheet along the defect position in the first region;
- a splitting structure, configured to split the semiconductor sheet that is cut and grooved;
- a heater, configured to perform heating treatment on the semiconductor sheet that is cut and grooved; and
- a cooling apparatus, configured to cool and corrode a heated semiconductor sheet; wherein the cooling apparatus comprises a cooling liquid having a corrosive acidic or alkaline substance.

10. The apparatus for manufacturing the semiconductor sheet assembly of claim 9, wherein the positioning and detecting structure specifically comprises:
- a positioning structure, configured to position the semiconductor sheet and determine a first region to be grooved; and
- a detecting structure, configured to acquire gray values of a plurality of positions in the first region, and taking a position of which the gray value is larger than or equal to 50% as the defect position.

11. The apparatus for manufacturing the semiconductor sheet assembly of claim 9, wherein the splitting structure is further configured to cut and groove the semiconductor sheet along the defect position in the first region and an edge point, and the edge point is an intersection point of a bisectrix of the semiconductor sheet and an edge of the semiconductor sheet.

12. The apparatus for manufacturing the semiconductor sheet assembly of claim 9, wherein the grooving structure is a laser grooving structure configured to perform discontinuous laser dotting and grooving on the semiconductor sheet along the defect position in the first region.

13. The apparatus for manufacturing the semiconductor sheet assembly of claim 9, further comprising a connecting structure configured to arrange cutting edges of a plurality of semiconductor split sheets formed by splitting by the splitting structure sequentially in a first direction, and to connect two adjacent semiconductor split sheets of the plurality of semiconductor split sheets by using an interconnection strip, to form a semiconductor sheet string.

14. The apparatus for manufacturing the semiconductor sheet assembly of claim 13, wherein the interconnection strip comprises a first section and a second section that extend in the first direction, and an intermediate section respectively connected to the first section and the second section; the first section is in a metalized electrical connection to an upper surface of one of the semiconductor split sheets, and the second section is in a metalized electrical connection to a lower surface of a next semiconductor split sheet of the semiconductor split sheets in the first direction.

15. The apparatus for manufacturing the semiconductor sheet assembly of claim 14, further comprising a laminating structure configured to overlap a glass panel, a first adhesive film, the semiconductor sheet string, a second adhesive film and a back plate sequentially to form an overlapped structure, and to laminate the overlapped structure.

16. The apparatus for manufacturing the semiconductor sheet assembly of claim 15, wherein the cutting edge in the semiconductor sheet string is arranged facing the glass panel.

* * * * *